(12) United States Patent
Yu

(10) Patent No.: US 10,818,870 B2
(45) Date of Patent: Oct. 27, 2020

(54) OLED ENCAPSULATION METHOD AND STRUCTURE

(71) Applicant: Wuhan China Star Optoelectronics Semiconductor Display Technology Co., Ltd., Wuhan, Hubei (CN)

(72) Inventor: Wei Yu, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 155 days.

(21) Appl. No.: 16/089,032

(22) PCT Filed: Sep. 6, 2018

(86) PCT No.: PCT/CN2018/104453
§ 371 (c)(1),
(2) Date: Sep. 27, 2018

(87) PCT Pub. No.: WO2019/157813
PCT Pub. Date: Aug. 22, 2019

(65) Prior Publication Data
US 2020/0168836 A1 May 28, 2020

(30) Foreign Application Priority Data

Feb. 13, 2018 (CN) .......................... 2018 1 0150448

(51) Int. Cl.
*H01L 51/52* (2006.01)
*H01L 51/56* (2006.01)

(52) U.S. Cl.
CPC .......... *H01L 51/5246* (2013.01); *H01L 51/56* (2013.01); *H01L 51/5237* (2013.01); *H01L 51/5253* (2013.01)

(58) Field of Classification Search
CPC ............. H01L 51/5253; H01L 51/5246; H01L 51/5237
See application file for complete search history.

(56) References Cited

U.S. PATENT DOCUMENTS

| 8,357,929 B2* | 1/2013 | Ryu ...................... H01L 51/525 |
| | | 257/40 |
| 9,525,153 B2* | 12/2016 | Oh ....................... H01L 51/524 |
| (Continued) | | |

FOREIGN PATENT DOCUMENTS

| CN | 1693377 A | 11/2005 |
| CN | 104201295 A | 12/2014 |
| (Continued) | | |

OTHER PUBLICATIONS

Google Patents translation of CN107591494 (Shenzhen China Star Optoelectronics Technology Co.) Jan. 16, 2018.*

*Primary Examiner* — Zandra V Smith
*Assistant Examiner* — John M Parker
(74) *Attorney, Agent, or Firm* — Leong C. Lei

(57) ABSTRACT

An Organic Light Emitting Diode (OLED) encapsulation method and structure are disclosed. The encapsulation method provides a thin film of lipophilicity in a fill region of an encapsulation cover. The lipophilicity of the thin film may attract the thermally curable fill adhesive of low viscosity, and therefore the fill adhesive in the fill region may spread to the corners of the fill region. After the encapsulation cover and an OLED substrate assembly are joined, the fill adhesive may completely fill up the space surrounded a dam adhesive between the encapsulation cover and the OLED substrate assembly, thereby preventing empty pockets formed at the corners and guaranteeing the encapsulation effect to the OLED device.

6 Claims, 16 Drawing Sheets

(56) References Cited

U.S. PATENT DOCUMENTS

| | | | |
|---|---|---|---|
| 2014/0353639 A1 | 12/2014 | Sakamoto et al. | |
| 2016/0035996 A1* | 2/2016 | Sun | H01L 51/5246 257/40 |
| 2017/0279076 A1* | 9/2017 | Song | H01L 27/3246 |
| 2019/0140206 A1* | 5/2019 | Liu | G09G 3/3208 |
| 2019/0207151 A1* | 7/2019 | Yang | H01L 51/5246 |
| 2019/0229299 A1* | 7/2019 | Peng | H01L 51/5256 |
| 2019/0386241 A1* | 12/2019 | Yu | H01L 51/56 |
| 2019/0386244 A1* | 12/2019 | Yang | H01L 51/5253 |

FOREIGN PATENT DOCUMENTS

| | | |
|---|---|---|
| CN | 105609660 A | 5/2016 |
| CN | 107591494 A | 1/2018 |
| CN | 108365124 A | 8/2018 |

\* cited by examiner

OLED ENCAPSULATION METHOD AND STRUCTURE

CROSS-REFERENCE TO RELATED APPLICATIONS

This application is a national phase entry of PCT Patent Application No. PCT/CN2018/104453, filed on Sep. 6, 2018, which claims priority to Chinese Patent Application 201810150448.X, filed on Feb. 13, 2018; both of which are hereby incorporated herein by reference in their entireties.

BACKGROUND OF THE INVENTION

(a) Technical Field of the Invention

The present invention is generally related to display technologies, and more particular to an Organic Light Emitting Diode (OLED) encapsulation method and an encapsulation structure.

(b) Description of the Prior Art

Organic Light Emitting Diode (OLED) is the new generation display technology. An OLED device includes a cathode, an anode, and an organic thin film sandwiched between the cathode and anode. The organic thin film will illuminate when a voltage is applied across the cathode and anode. Compared to liquid crystal displays (LCDs), OLED displays have advantages such as self-illuminating, fast response, wide viewing angle, and enhanced color saturation.

An OLED device may fail due to that the moist in the air may oxidize reactive metal and react with the organic material. Effective encapsulation to the OLED device so as to fully isolate the OLED device from the moist is therefore crucial in prolonging the operation life of OLED device.

Currently, OLED encapsulation mainly has the following methods: desiccant and UV adhesive, face seal, frit glass, thin film, etc. The so-called dam & fill method is a type of face seal. FIG. 1 is a schematic diagram showing an OLED encapsulation structure using the dam & fill method. As illustrated, the dam 300 blocks moist and the fill adhesive 400 helps the OLED device 220 not only to withstand external pressure but also to block moist. The passivation layer 230 prevents the fill adhesive 400 from directly contacting with the OLED device 220 so that the characteristics of the OLED device may remain intact. The dam & fill method is a promising encapsulation method due to its flexibility and applicability to devices of various dimensions.

As shown in FIGS. 1 to 6, a typical dam & fill method includes the following steps.

In step S1, as shown in FIGS. 2 to 5, a square-shaped dam 300 is dispensed on the encapsulation cover 100, forming an enclosed area 140. A fill adhesive 400 of low viscosity is filled in the enclosed area 140.

In step S2, as shown in FIG. 6, an OLED substrate assembly 200 with an OLED device 220 on it is joined to the encapsulation cover 100. The dam 300 and the fill adhesive 400 are cured, and an OLED encapsulation structure shown in FIG. 1 is achieved.

As shown in FIGS. 4 and 5, the fill adhesive 400 in step S is difficult to spread to the four corners 510 of the fill area 140 as the fill adhesive 400 has a specific viscosity and the four corners are farther away from where the fill adhesive 400 is dispensed. As shown in FIG. 1, without the fill adhesive 400's protection at the four corners 510, the OLED encapsulation structure's moist insulation function is compromised, resulting in the malfunction of OLED device 220.

SUMMARY OF THE INVENTION

An objective of the present invention is to provide an Organic Light Emitting Diode (OLED) encapsulation method that provides a thin film of lipophilicity in a fill region of an encapsulation cover. The lipophilicity of the thin film may attract the fill adhesive of low viscosity, and therefore the fill adhesive in the fill region may spread to the corners of the fill region.

Another objective of the present invention is to provide an OLED encapsulation structure, where a thin film of lipophilicity is disposed in a fill region of an encapsulation cover so that all corners of the fill region would be filled by fill adhesive and the encapsulation effect of the OLED device is guaranteed.

To achieve the objectives, the OLED encapsulation method includes the following steps.

Step S1: providing an encapsulation cover, defining on the encapsulation cover a dam region of an enclosed shape and a fill region surrounded by the dam region where the fill region has with a number of corners, and disposing one or more thin films of lipophilicity in the fill region that cover at least all corners.

Step S2: dispensing a dam adhesive in the dam region, and a fill adhesive in the fill region, where, under the one or more thin films' the attraction, the fill adhesive is spread to all corners uniformly covering the fill region.

Step S3: providing an OLED substrate assembly, joining the OLED substrate assembly to the encapsulation cover, where the fill adhesive fully fills an enclosed space surrounded by the dam adhesive between the encapsulation cover and the OLED substrate assembly, and curing the dam adhesive and the fill adhesive.

The one or more thin films may cover only the corners; and the one or more thin films are overlapped with a spread region of the fill adhesive dispensed in the step S2.

The one or more thin films may cover the entire fill region.

The one or more thin films are made of a composite material including $TiO_2$-$ZnO$; and the one or more thin films are disposed as follow: obtaining nanoscale $TiO_2$-$ZnO$ powders through sol-gel method; mixing the nanoscale $TiO_2$-$ZnO$ powders with an organic solution; coating the organic solution on the encapsulation cover through a dispensing device.

The step S2 includes the following steps: after dispensing the fill adhesive into the fill region, exposing the fill adhesive to an UV light through a first UV mask plate, where the first UV mask plate has a first transparent region corresponding to the fill region, and a first opaque region corresponding to the dam region.

The dam adhesive is an UV-curable adhesive; the fill adhesive is a thermally curable adhesive of a low viscosity; in the step S3, the dam adhesive between the OLED substrate assembly and the encapsulation cover is cured by UV light and the fill adhesive between the OLED substrate assembly and the encapsulation cover is cured by heating; and the dam adhesive is cured by the following steps: exposing the dam adhesive an UV light through a second UV mask plate, where the second UV mask plate has a second opaque region corresponding to the fill region and a second transparent region corresponding to the dam region.

To achieve the objectives, the OLED encapsulation structure includes an encapsulation cover an OLED substrate assembly correspondingly joined to the encapsulation cover, a dam adhesive of an enclosed shape between the encapsulation cover and the OLED substrate assembly; and a fill adhesive completely filled up a space surrounded by the dam adhesive between the encapsulation cover and the OLED substrate assembly.

The encapsulation cover has a dam region of an enclosed shape and a fill region surrounded by the dam region, both on a side of the encapsulation cover; the fill region has a number of corners; one or more thin films of lipophilicity are disposed in the fill region, at least covering all corners.

The dam adhesive is dispensed in the dam region, and the fill adhesive is dispensed in the fill region.

Each corner is covered by one of the one or more thin films.

The one or more thin films may cover the entire fill region.

The one or more thin films are made of a composite material including $TiO_2$—ZnO; the dam adhesive is an UV-curable adhesive; and the fill adhesive is a thermally curable adhesive.

The present invention further provides an OLED encapsulation method that includes the following steps.

Step S1: providing an encapsulation cover, defining on the encapsulation cover a dam region of an enclosed shape and a fill region surrounded by the dam region where the fill region has with a number of corners, and disposing one or more thin films of lipophilicity in the fill region that cover at least all corners.

Step S2: dispensing a dam adhesive in the dam region, and a fill adhesive in the fill region, where, under the one or more thin films' the attraction, the fill adhesive is spread to all corners uniformly covering the fill region.

Step S3: providing an OLED substrate assembly, joining the OLED substrate assembly to the encapsulation cover, where the fill adhesive fully fills an enclosed space surrounded by the dam adhesive between the encapsulation cover and the OLED substrate assembly, and curing the dam adhesive and the fill adhesive.

The one or more thin films may cover only the corners; and the one or more thin films are overlapped with a spread region of the fill adhesive dispensed in the step S2.

The one or more thin films are made of a composite material including TiO2-ZnO; and the one or more thin films are disposed as follow: obtaining nanoscale TiO2-ZnO powders through sol-gel method; mixing the nanoscale TiO2-ZnO powders with an organic solution; coating the organic solution on the encapsulation cover through a dispensing device.

The step S2 includes the following steps: after dispensing the fill adhesive into the fill region, exposing the fill adhesive to an UV light through a first UV mask plate, where the first UV mask plate has a first transparent region corresponding to the fill region, and a first opaque region corresponding to the dam region.

The dam adhesive is an UV-curable adhesive; the fill adhesive is a thermally curable adhesive of a low viscosity; in the step S3, the dam adhesive between the OLED substrate assembly and the encapsulation cover is cured by UV light and the fill adhesive between the OLED substrate assembly and the encapsulation cover is cured by heating; and the dam adhesive is cured by the following steps: exposing the dam adhesive an UV light through a second UV mask plate, where the second UV mask plate has a second opaque region corresponding to the fill region and a second transparent region corresponding to the dam region.

The foregoing objectives and summary provide only a brief introduction to the present invention. To fully appreciate these and other objects of the present invention as well as the invention itself all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

FIG. 16 is a sectional diagram showing an encapsulation structure of the present invention.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
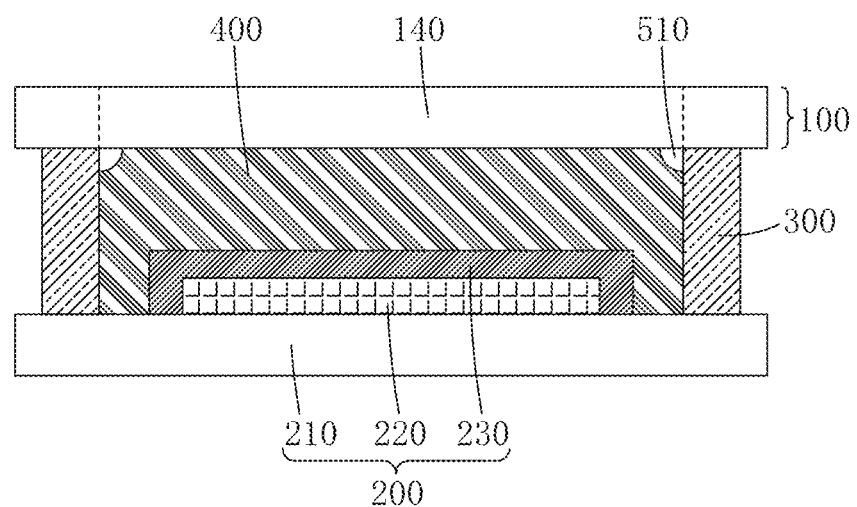
FIG. 1 is a sectional diagram showing an encapsulation structure achieved by a conventional dam & fill OLED encapsulation method.
Figure 2:
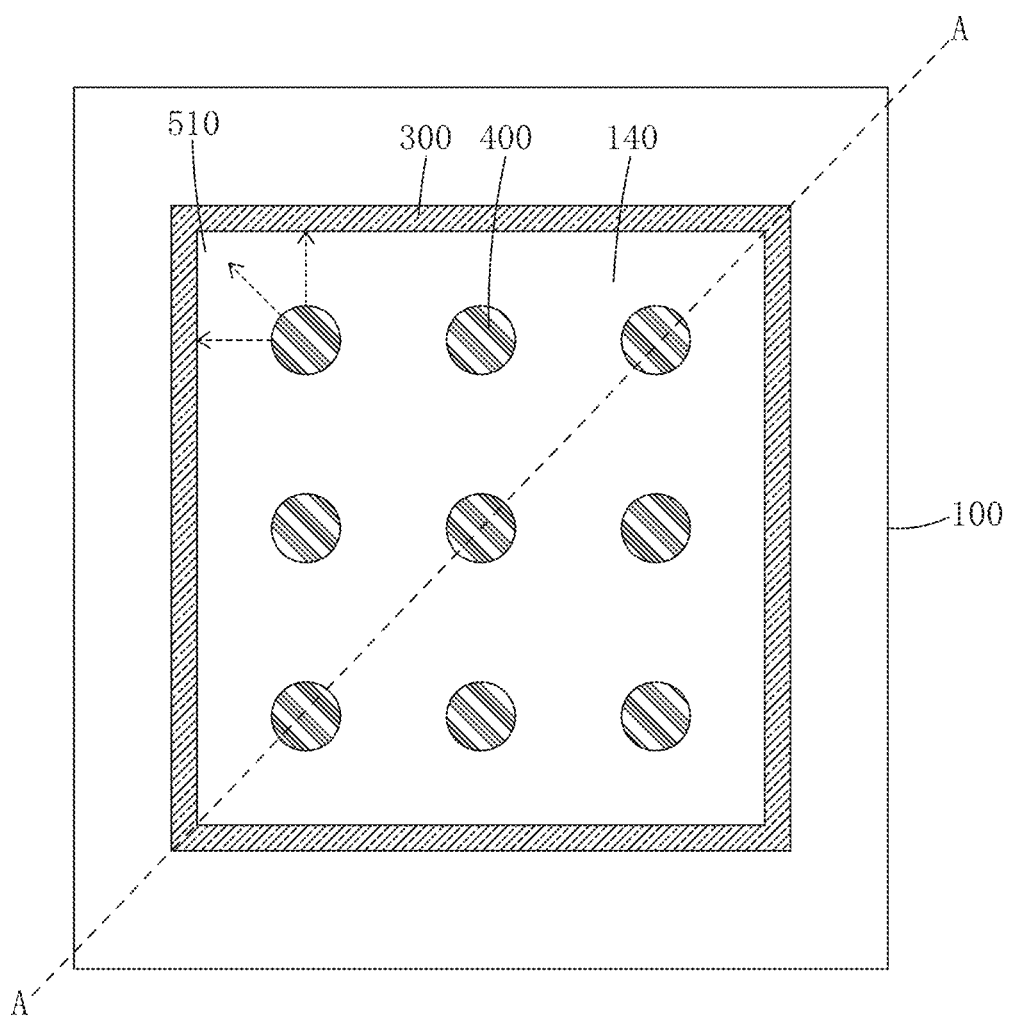
FIGS. 2 and 4 are top-view diagrams showing an encapsulation structure under the step S1 of a conventional dam & fill OLED encapsulation method.
Figure 3:
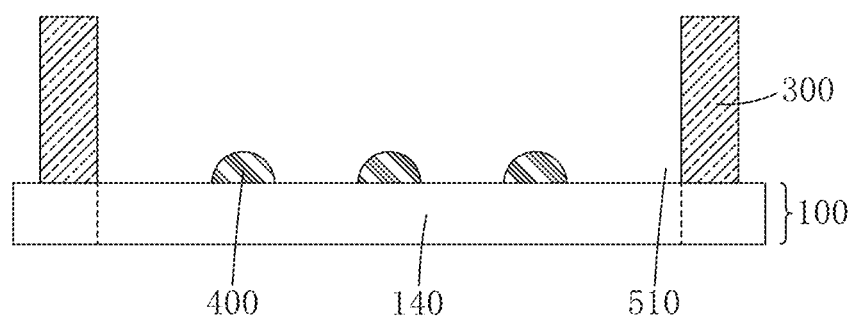
FIG. 3 is a sectional diagram along the A-A line of the encapsulation structure of FIG. 2.
Figure 4:
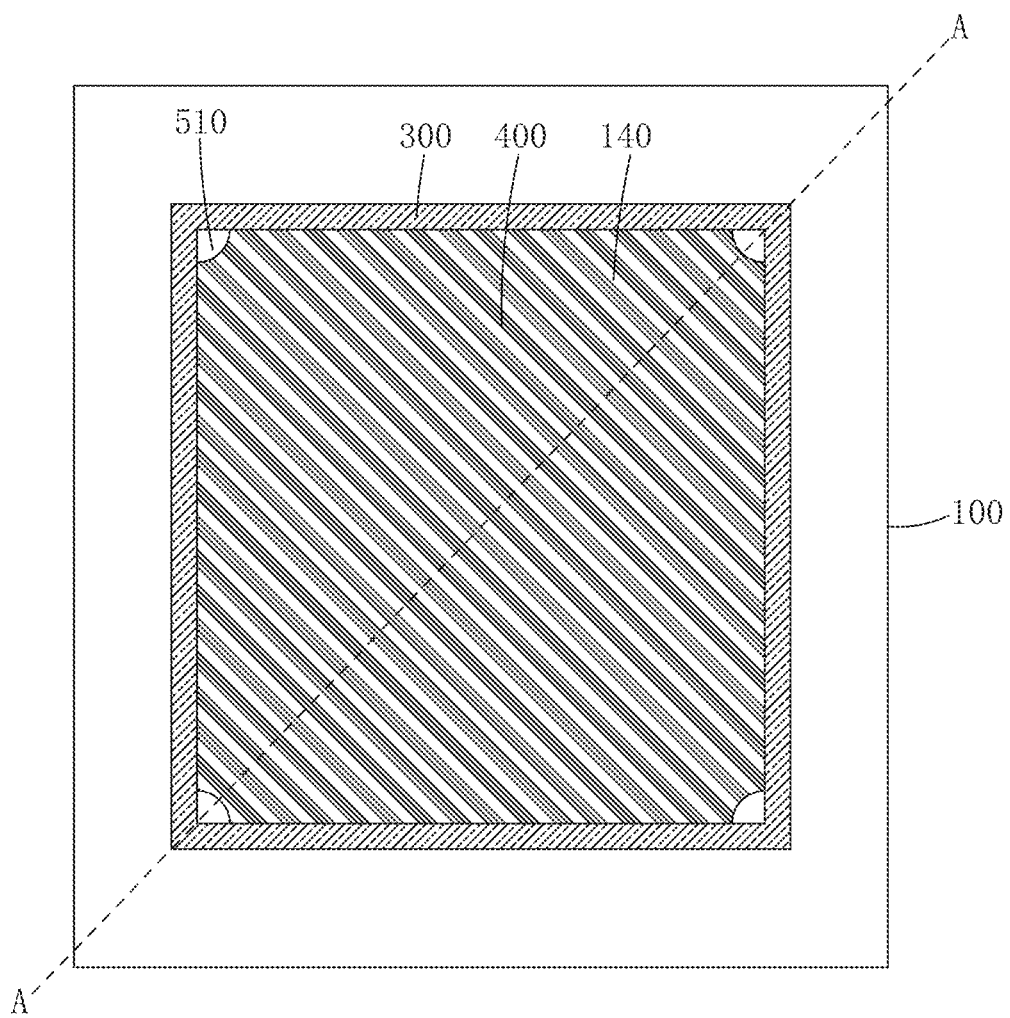
Figure 5:
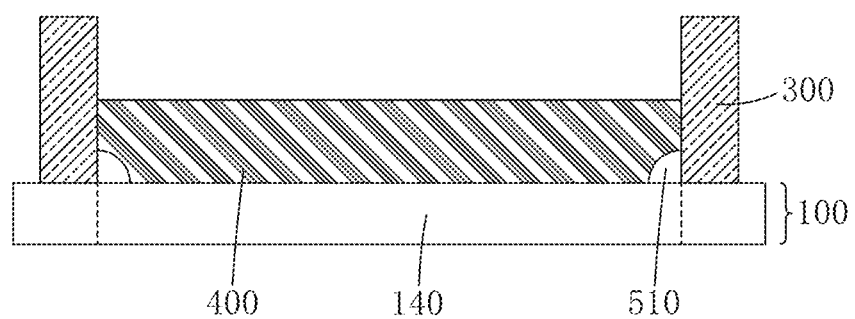
FIG. 5 is a sectional diagram along the A-A line of the encapsulation structure of FIG. 4.
Figure 6:
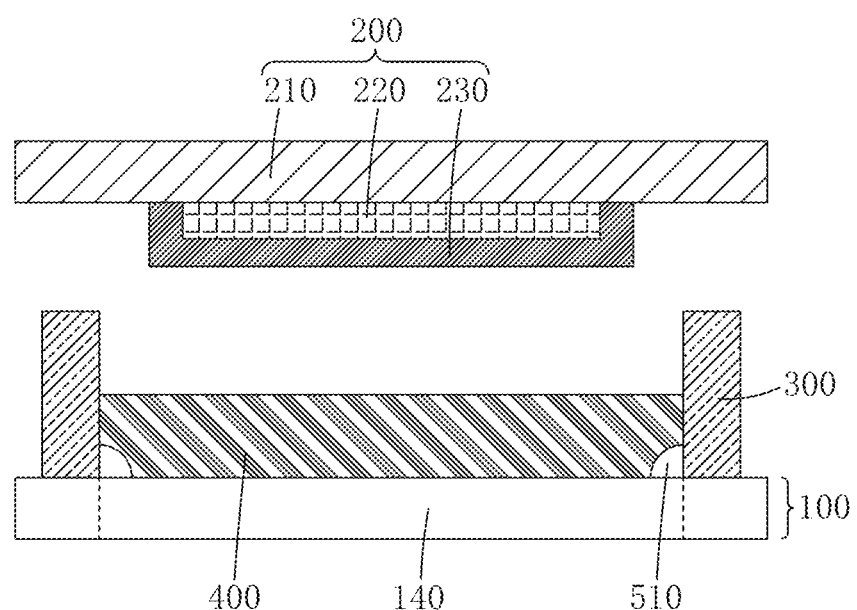
FIG. 6 is a sectional diagram showing an encapsulation structure under the step S2 of a conventional dam & fill OLED encapsulation method.
Figure 7:
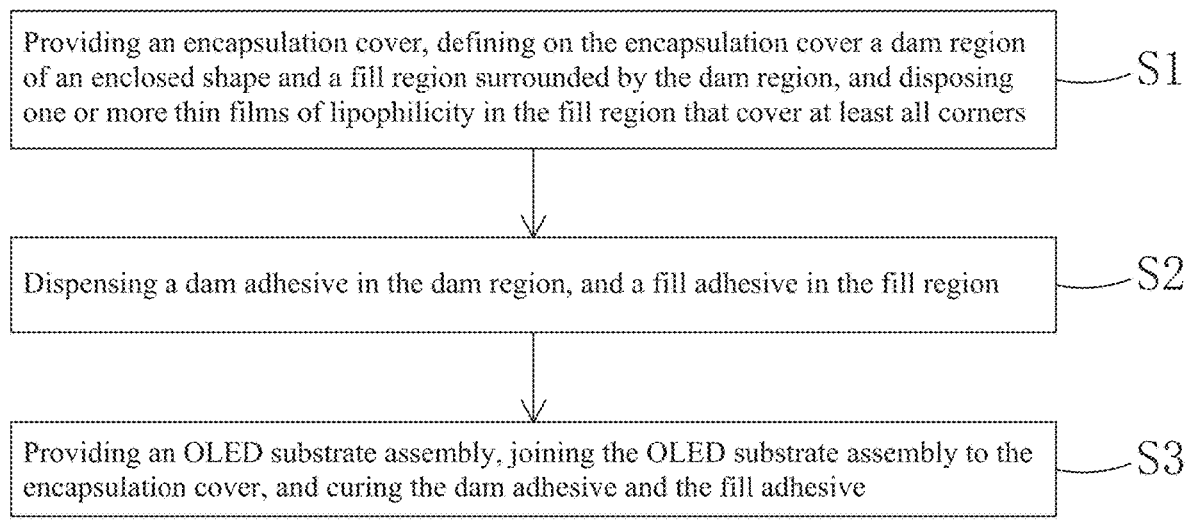
FIG. 7 is a flow diagram showing the steps of an OLED encapsulation method according to an embodiment of the present invention.

As shown in FIG. 7, an Organic Light Emitting Diode (OLED) encapsulation method according to an embodiment of the present invention includes the following steps.

Figure 8:
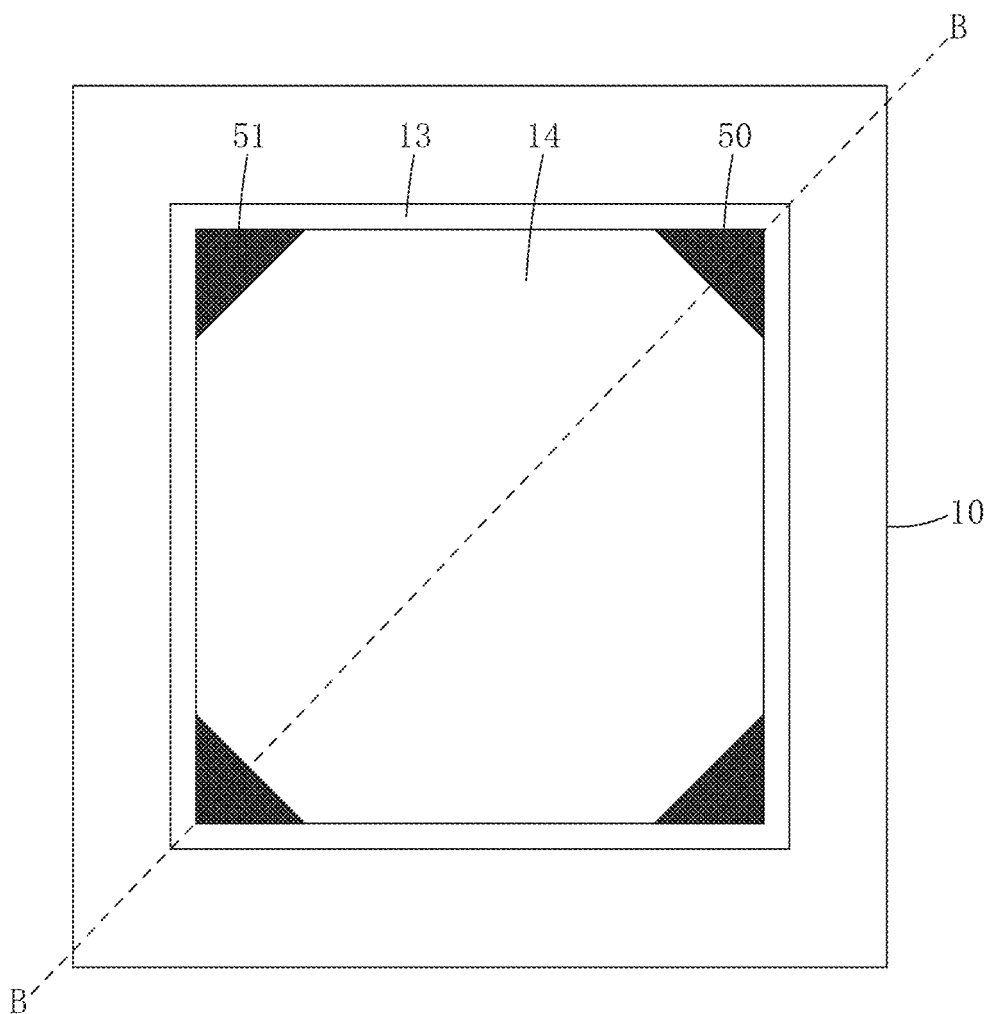
FIG. 8 is a top-view diagram showing an encapsulation structure under the step S of the OLED encapsulation method of FIG. 7.
Figure 9:
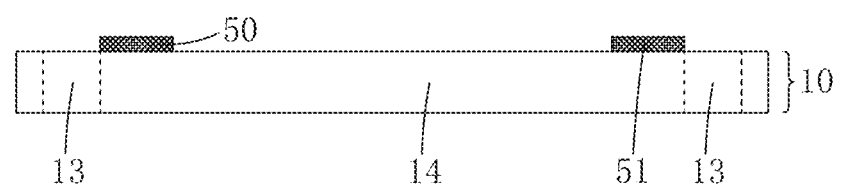
FIG. 9 is a sectional diagram along the B-B line of the encapsulation structure of FIG. 8.

In step S1, as shown in FIGS. 8 and 9, an encapsulation cover 10 is provided. The encapsulation cover 10 has a dam region 13 of an enclosed shape and a fill region 14 surrounded by the dam region 13 defined. The fill region 14 has a number of corners 51. At least a thin film 50 of lipophilicity is disposed in the fill region 14, at least covering all corners 51.

Specifically, the fill region 14 has a rectangular shape and therefore has four corners 51.

Specifically, as shown in FIGS. 8 and 9, there may be multiple thin films 50, each covering a corner 51. These thin films 50 will be overlapped with a spread region of a fill adhesive 40 in the subsequent step S2.

Specifically, the thin films 50 covering the respective corners 51 are extended along included sides of the corners 51. Preferably, the thin films 50 covering the respective corners 51 have isosceles right triangular shapes.

Specifically, the one or more thin films 50 may cover part of the fill region 14 other than the four corners 51. In one embodiment, a single thin film 50 covers the entire fill region 14.

Specifically, the one or more thin films 50 are made of a composite material including TiO2-ZnO.

The thin films 50 may be provided as follow: obtaining nanoscale TiO2-ZnO powders through sol-gel method, mixing the nanoscale TiO2-ZnO powders with an organic solution, and coating the solution on the cover 10 through a dispensing device to form the thin film(s) 50.

The lipophilicity of the thin film(s) 50 may attract the thermally curable fill material of low viscosity (an organic material), and therefore the fill adhesive 40 in the fill region 14 may spread to the corners 51, thereby guaranteeing the encapsulation effect to the OLED device 22.

Figure 10:
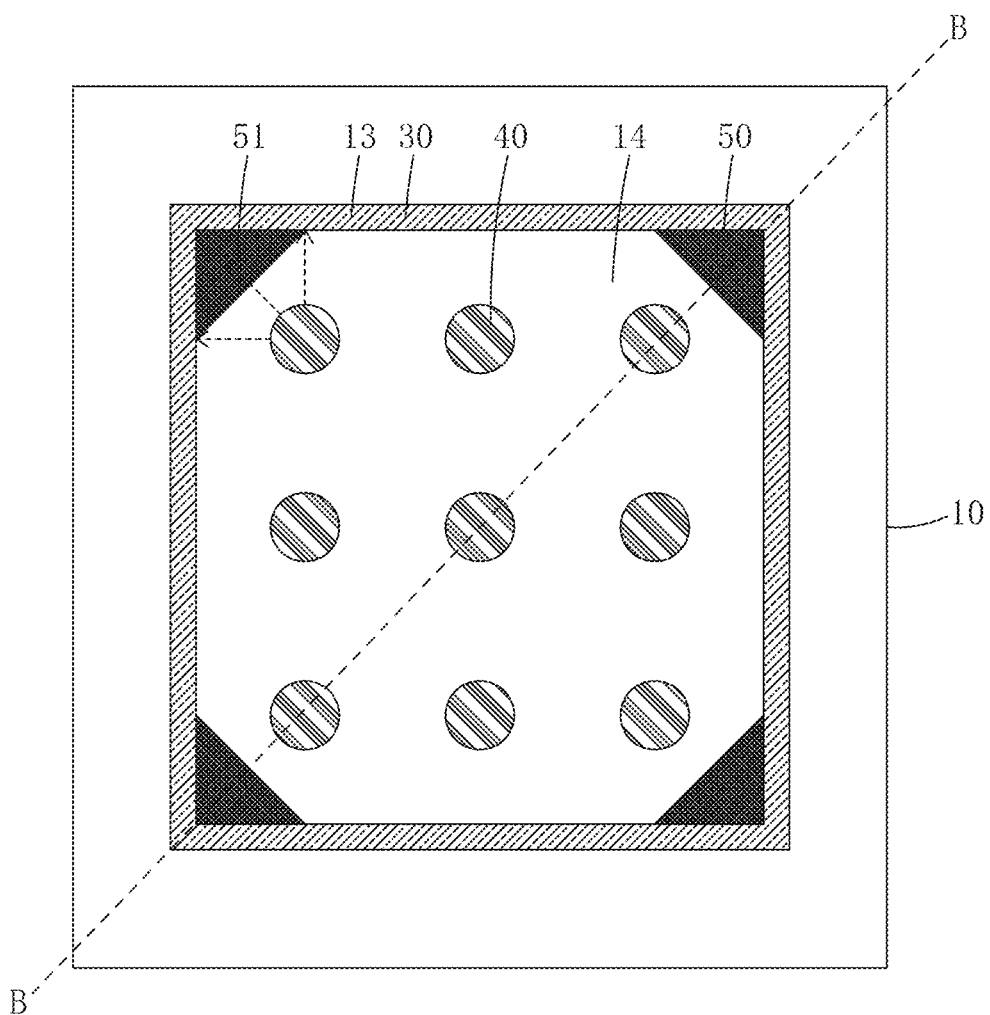
FIGS. 10 and 12 are top-view diagrams showing an encapsulation structure under the step S2 of the OLED encapsulation method of FIG. 7.
Figure 11:
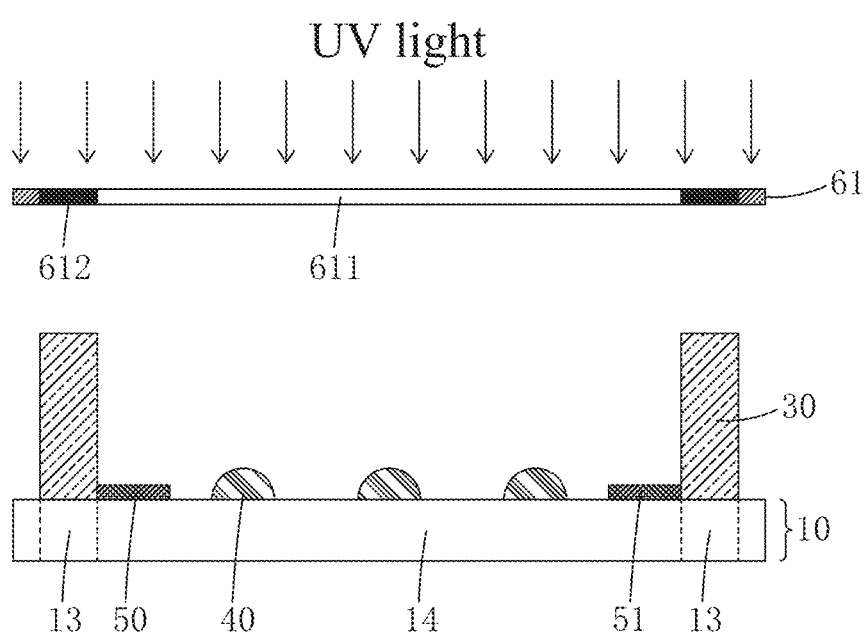
FIG. 11 is a sectional diagram along the B-B line of the encapsulation structure of FIG. 10.
Figure 12:
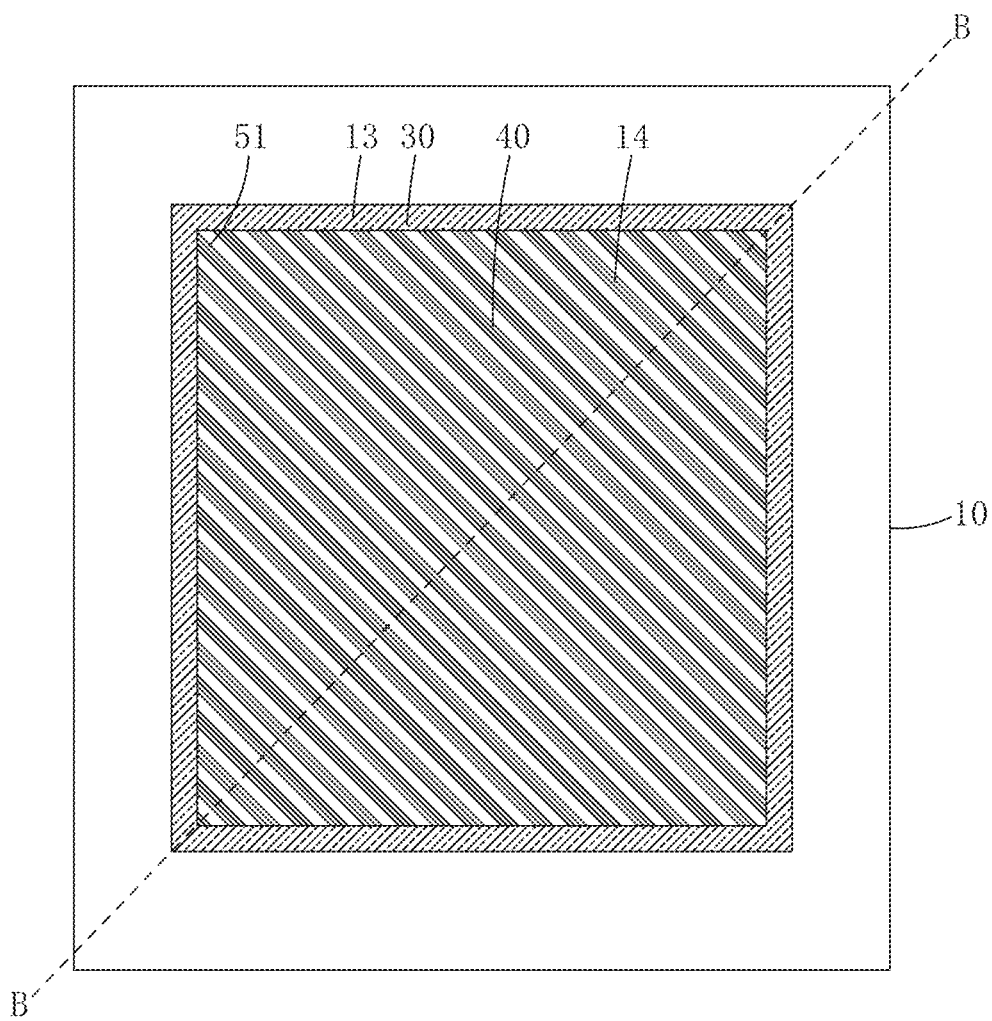
Figure 13:
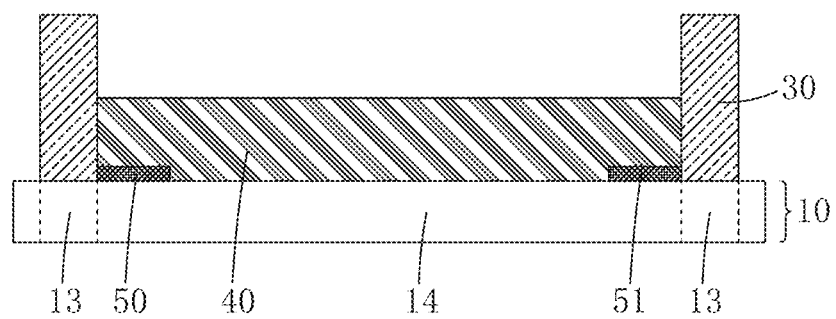
FIG. 13 is a sectional diagram along the B-B line of the encapsulation structure of FIG. 12.

In step S2, as shown in FIGS. 10 to 13, a dam adhesive 30 is dispensed in the dam region 13, and a fill adhesive 40 is dispensed in the fill region 14 (as shown in FIGS. 10 and 11). Under the attraction of the thin film(s) 50, the fill adhesive 40 is spread uniformly in the fill region 14 up to all corners 51 (as shown in FIGS. 12 and 13).

Specifically, the dam adhesive 30 is an UV-curable adhesive, and the fill adhesive 40 is a thermally curable adhesive of a low viscosity.

Preferably, the step S2 includes the following steps. As shown in FIG. 11, after dispensing the fill adhesive 40 into the fill region 14, the fill adhesive 40 is exposed to an UV light through a first UV mask plate 61. The first UV mask plate 61 has a first transparent region 611 corresponding to the fill region 14, and a first opaque region 612 corresponding to the dam region 13. The first opaque region 612 prevents the dam adhesive 30 in the dam region 13 from being exposed to and cured by the UV light.

Specifically, by the exposure to the UV light, the lipophilicity of the TiO2-ZnO composite material would be increased, and the attraction from the thin film(s) 50 to the fill adhesive 40 would be more significant. The fill adhesive 40 is therefore uniformly spread to all corners 51 of the fill region 14. As such, the encapsulation of the OLED device 22 is guaranteed by resolving the issue that the fill adhesive 40 fails to reach the far corners.

Figure 14:
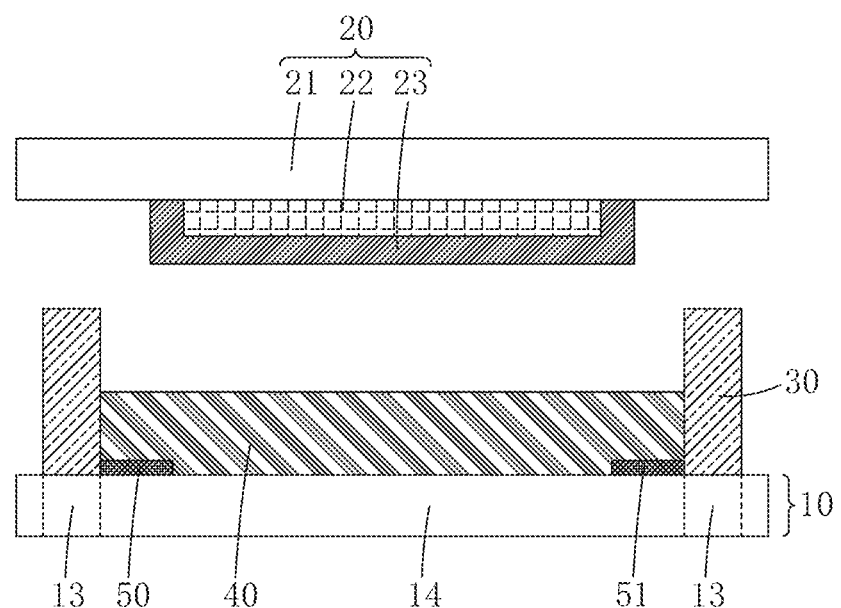
FIGS. 14 to 16 are sectional diagram showing an encapsulation structure under the step S3 of the OLED encapsulation method of FIG. 7.
Figure 15:
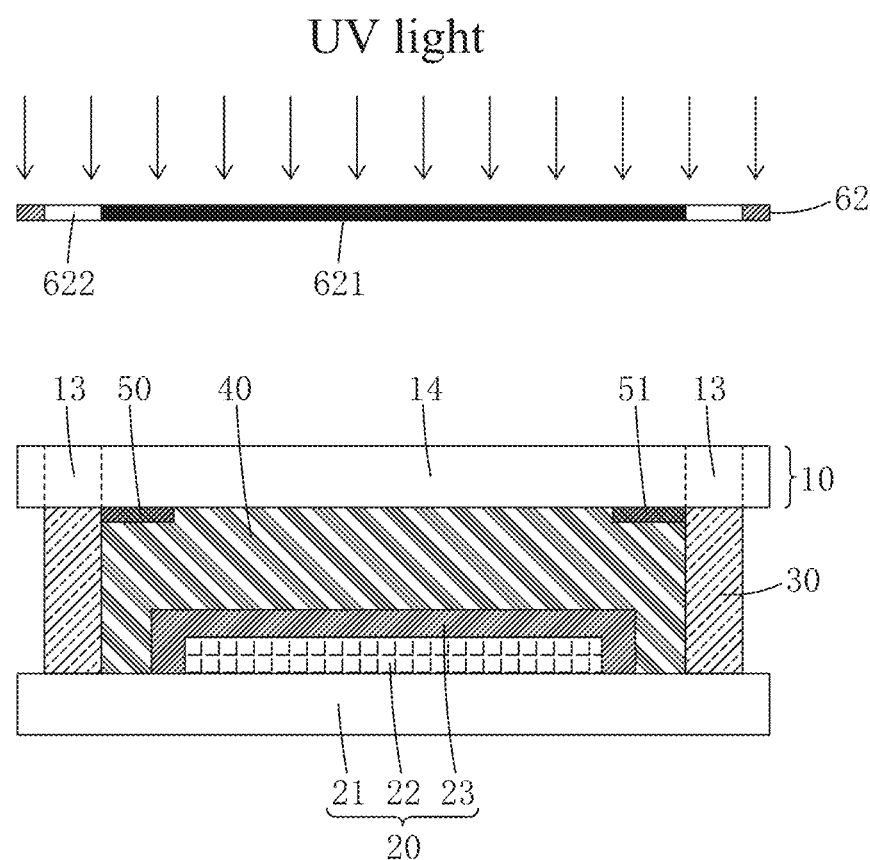
Figure 16:
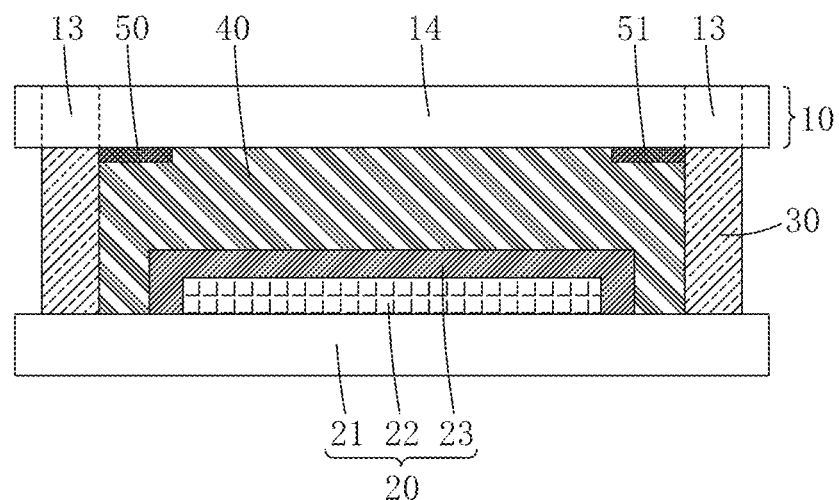

In step S3, as shown in FIGS. 14 to 16, an OLED substrate assembly 20 is provided and the OLED substrate assembly 20 is matched and joined to the encapsulation cover 10. The fill adhesive 40 fully fills an enclosed space surrounded by the encapsulation cover 10, the OLED substrate assembly 20, and the dam adhesive 30. Then, the dam adhesive 30 and the fill adhesive 40 are cured and an OLED encapsulation structure is achieved.

Specifically, the OLED substrate assembly 20 includes a substrate 21, an OLED device 22 on the substrate 21, and a passivation layer 23 covering the OLED device 22. The OLED device 22 is disposed corresponding to the inside of the fill region 14 of the encapsulation cover 10.

Specifically, the passivation layer 23 is a layer of silicon nitride, a layer of silicon oxide, or a stacked assembly of the two.

Specifically, in step S3, the dam adhesive 30 between the OLED substrate assembly 20 and the encapsulation cover 10 is cured by UV light, whereas the fill adhesive 40 between the OLED substrate assembly 20 and the encapsulation cover 10 is cured by heating.

Specifically, as shown in FIG. 15, the dam adhesive 30 is cured as follows. The dam adhesive 30 is exposed to an UV light through a second UV mask plate 62. The second UV mask plate 62 has a second opaque region 621 corresponding to the fill region 14 and a second transparent region 622 corresponding to the dam region 13. The second opaque region 621 shields the OLED device 22 within the fill region 14 so that it is not exposed to and damaged by the UV light.

The lipophilicity of the thin film(s) 50 may attract the thermally curable fill material of low viscosity, and therefore the fill adhesive 40 in the fill region 14 may spread to the corners 51. After the encapsulation cover 10 and the OLED substrate assembly 20 are joined, the fill adhesive 40 may completely fill up the space surrounded by the encapsulation cover 10, the OLED substrate assembly 20, and the dam adhesive 30, thereby preventing empty pockets formed at the corners 51 and guaranteeing the encapsulation effect to the OLED device 22.

As shown in FIG. 16, in step S1, as shown in FIGS. 8 and 9, an encapsulation cover 10 is provided. The encapsulation cover 10 has a dam region 13 of an enclosed shape and a fill region 14 surrounded by the dam region 13 defined. The fill region 14 has a number of corners 51. At least a thin film 50 of lipophilicity is disposed in the fill region 14, at least covering all corners 51.

As shown in FIG. 16, based on the described OLED encapsulation method, the present invention also discloses an OLED encapsulation structure, which includes an encapsulation cover 10, an OLED substrate assembly 20 correspondingly joined to the encapsulation cover 10, a dam adhesive 30 of an enclosed shape between the encapsulation cover 10 and the OLED substrate assembly 20, and a fill adhesive 40 completely filled up a space surrounded by the dam adhesive 30 between the encapsulation cover 10 and the OLED substrate assembly 20.

The encapsulation cover 10 has a dam region 13 of an enclosed shape and a fill region 14 surrounded by the dam region 13, both on a side of the encapsulation cover 10. The fill region 14 has a number of corners 51. At least a thin film 50 of lipophilicity is disposed in the fill region 14, at least covering all corners 51.

The dam adhesive 30 is dispensed in the dam region 13, and the fill adhesive 40 is dispensed in the fill region 14.

Specifically, the fill region 14 has a rectangular shape and therefore has four corners 51.

Specifically, as shown in FIGS. 8 and 9, there may be multiple thin films 50, each covering a corner 51.

Specifically, the thin films 50 covering the respective corners 51 are extended along included sides of the corners 51. Preferably, the thin films 50 covering the respective corners 51 have isosceles right triangular shapes.

Specifically, the one or more thin films 50 may cover part of the fill region 14 other than the four corners 51. In one embodiment, a single thin film 50 covers the entire fill region 14.

Specifically, the one or more thin films 50 are made of a composite material including TiO2-ZnO.

Specifically, the dam adhesive 30 is an UV-curable adhesive, and the fill adhesive 40 is a thermally curable adhesive of a low viscosity.

Specifically, the OLED substrate assembly 20 includes a substrate 21, an OLED device 22 on the substrate 21, and a passivation layer 23 covering the OLED device 22. The OLED device 22 is disposed corresponding to the inside of the fill region 14 of the encapsulation cover 10.

Specifically, the passivation layer 23 is a layer of silicon nitride, a layer of silicon oxide, or a stacked assembly of the two.

Specifically, the dam adhesive 30 blocks moist and the fill adhesive 40 helps the OLED device 22 not only to withstand external pressure but also to block moist. The passivation layer 23 prevents the fill adhesive 40 from directly contacting with the OLED device 22 so that the characteristics of the OLED device 22 may remain intact.

By disposing thin film(s) 50 in the fill region 14 of the encapsulation cover 10, all corners of the encapsulation structure are filled up by the fill adhesive 40, guaranteeing the encapsulation effect to the OLED device 22.

The lipophilicity of the thin film(s) may attract the thermally curable fill material of low viscosity, and therefore the fill adhesive in the fill region may spread to the corners of the fill region. After the encapsulation cover and an OLED substrate assembly are joined, the fill adhesive may completely fill up the space surrounded a dam adhesive between the encapsulation cover and the OLED substrate assembly, thereby preventing empty pockets formed at the corners and guaranteeing the encapsulation effect to the OLED device.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

I claim:

1. An Organic Light Emitting Diode (OLED) encapsulation method, comprising:
   S1: providing an encapsulation cover, defining on the encapsulation cover a dam region of an enclosed shape and a fill region surrounded by the dam region where the fill region has with a plurality of corners, and disposing one or more thin films of lipophilicity in the fill region that cover at least all corners;
   S2: dispensing a dam adhesive in the dam region, and a fill adhesive in the fill region, where, under the one or more thin films' the attraction, the fill adhesive is spread to all corners uniformly covering the fill region; and
   S3: providing an OLED substrate assembly, joining the OLED substrate assembly to the encapsulation cover, where the fill adhesive fully fills an enclosed space surrounded by the dam adhesive between the encapsulation cover and the OLED substrate assembly, and curing the dam adhesive and the fill adhesive;
   wherein the one or more thin films are made of a composite material comprising TiO2-ZnO; and the one or more thin films are disposed as follows:
      obtaining nanoscale TiO2-ZnO powders through sol-gel method;
      mixing the nanoscale TiO2-ZnO powders with an organic solution; and
      coating the organic solution on the encapsulation cover through a dispensing device.

2. The encapsulation method according to claim 1, wherein the one or more thin films cover only the corners; and the one or more thin films are overlapped with a spread region of the fill adhesive dispensed in the step S2.

3. The encapsulation method according to claim 1, wherein the one or more thin films cover the entire fill region.

4. The encapsulation method according to claim 1, wherein the step S2 comprises the following steps:
   after dispensing the fill adhesive into the fill region, exposing the fill adhesive to an UV light through a first UV mask plate, where the first UV mask plate has a first transparent region corresponding to the fill region, and a first opaque region corresponding to the dam region.

5. The encapsulation method according to claim 1, wherein the dam adhesive is an UV-curable adhesive; the fill adhesive is a thermally curable adhesive of a low viscosity; in the step S3, the dam adhesive between the OLED substrate assembly and the encapsulation cover is cured by UV light and the fill adhesive between the OLED substrate assembly and the encapsulation cover is cured by heating; and the dam adhesive is cured by the following steps:
   exposing the dam adhesive an UV light through a second UV mask plate, where the second UV mask plate has a second opaque region corresponding to the fill region and a second transparent region corresponding to the dam region.

6. An OLED encapsulation method, comprising:
   S1: providing an encapsulation cover, defining on the encapsulation cover a dam region of an enclosed shape and a fill region surrounded by the dam region where the fill region has with a plurality of corners, and disposing one or more thin films of lipophilicity in the fill region that cover at least all corners;
   S2: dispensing a dam adhesive in the dam region, and a fill adhesive in the fill region, where, under the one or more thin films' the attraction, the fill adhesive is spread to all corners uniformly covering the fill region; and
   S3: providing an OLED substrate assembly, joining the OLED substrate assembly to the encapsulation cover, where the fill adhesive fully fills an enclosed space surrounded by the dam adhesive between the encapsulation cover and the OLED substrate assembly, and curing the dam adhesive and the fill adhesive;
   wherein the one or more thin films cover only the corners; and the one or more thin films are overlapped with a spread region of the fill adhesive dispensed in the step S2;
   the one or more thin films are made of a composite material comprising TiO2-ZnO; and the one or more thin films are disposed as follows:
      obtaining nanoscale TiO2-ZnO powders through sol-gel method;
      mixing the nanoscale TiO2-ZnO powders with an organic solution; and coating the organic solution on the encapsulation cover through a dispensing device;

the step S2 comprises the following steps: after dispensing the fill adhesive into the fill region, exposing the fill adhesive to an UV light through a first UV mask plate, where the first UV mask plate has a first transparent region corresponding to the fill region, and a first opaque region corresponding to the dam region;

the dam adhesive is an UV-curable adhesive; the fill adhesive is a thermally curable adhesive of a low viscosity;

in the step S3, the dam adhesive between the OLED substrate assembly and the encapsulation cover is cured by UV light and the fill adhesive between the OLED substrate assembly and the encapsulation cover is cured by heating; and the dam adhesive is cured by the following steps; exposing the dam adhesive an UV light through a second UV mask plate, where the second UV mask plate has a second opaque region corresponding to the fill region and a second transparent region corresponding to the dam region.

* * * * *